(12) United States Patent
Mattila et al.

(10) Patent No.: US 11,427,383 B2
(45) Date of Patent: Aug. 30, 2022

(54) PLASTIC ENCLOSURE FOR ENCLOSING INDUSTRIAL COMPONENTS

(71) Applicant: Ensto Building Systems Oy, Porvoo (FI)

(72) Inventors: Reijo Mattila, Vantaa (FI); Timo Tuomisto, Helsinki (FI); Markus Niemi, Nurmijärvi (FI); Turkka Heiska, Helsinki (FI)

(73) Assignee: Ensto Oy, Porvoo (FI)

( * ) Notice: Subject to any disclaimer, the term of this patent is extended or adjusted under 35 U.S.C. 154(b) by 114 days.

(21) Appl. No.: 16/761,924

(22) PCT Filed: Nov. 8, 2017

(86) PCT No.: PCT/FI2017/050766
§ 371 (c)(1),
(2) Date: May 6, 2020

(87) PCT Pub. No.: WO2019/092303
PCT Pub. Date: May 16, 2019

(65) Prior Publication Data
US 2021/0371164 A1 Dec. 2, 2021

(51) Int. Cl.
*B65D 25/06* (2006.01)
*B65D 43/16* (2006.01)
*B65D 55/02* (2006.01)

(52) U.S. Cl.
CPC .......... *B65D 25/06* (2013.01); *B65D 43/163* (2013.01); *B65D 55/02* (2013.01)

(58) Field of Classification Search
CPC ....... B65D 25/06; B65D 43/163; B65D 55/02
(Continued)

(56) References Cited

U.S. PATENT DOCUMENTS 4,908,733 A * 3/1990 Zachrei ................. H02B 1/40
220/3.3
5,084,596 A 1/1992 Borsh et al.
(Continued)

FOREIGN PATENT DOCUMENTS

WO      WO 97/40652 A1    10/1997

OTHER PUBLICATIONS

International Search Report for corresponding International Patent Application No. PCT/FI2017/050766 dated Jun. 25, 2018, 5 pages.
Written Opinion of the International Searching Authority for corresponding International Patent Application No. PCT/FI2017/050766 dated Jun. 25, 2018, 8 pages.

*Primary Examiner* — J. Gregory Pickett
*Assistant Examiner* — Niki M Eloshway
(74) *Attorney, Agent, or Firm* — Merchant & Gould P.C.

(57) ABSTRACT

The invention relates to a plastic enclosure (1) for enclosing industrial components. The enclosure comprising a case (2) made of plastics. The case comprises a rectangular rear wall (3) and four side walls (4, 5, 6, 7) delimiting an interior (8) having four corners (9, 10, 11, 12) at the junctures of side walls. The rear wall and the side walls together form a monolithic unitary box-like container which has a mouth opening (13) at one side enabling access to the interior. Each corner comprises fastening means for fastening of one or more panels (P; P1) inside the interior in parallel and at a desired distance relative to the rear wall. The fastening means comprises a pair of rib members (14, 15) molded integrally as unitary monolithic structures with the side walls. The rib members extend along the side walls between the rear wall and the mouth opening. Each rib member comprises a plurality of equally spaced grooves (16) extending at right angle relative to the longitudinal direction of the rib member. The grooves (16) in the pair of the rib members (14, 15) of each corner are arranged as pairs of grooves which are mutually aligned, mutually located at the same (Continued)

level and facing each other. A support block (17) made of plastics having at least one pair of tongues (18) is adapted to be inserted into the at least one pair of grooves (16) to form tongue-and-groove joints at the two sides of the support block for holding the support block when installed to the corner. The support block (17) has a fastening element (19) for fastening of the panel (P; P1) to the support block.

21 Claims, 9 Drawing Sheets

(58) Field of Classification Search
USPC .............................. 220/528, 529; 211/41.1
See application file for complete search history.

(56) References Cited

U.S. PATENT DOCUMENTS

| | | | |
|---|---|---|---|
| 6,098,816 A | 8/2000 | Sonntag | |
| 6,604,798 B1 | 8/2003 | Cooney | |
| 8,656,637 B2* | 2/2014 | Wuster | A01G 9/20 |
| | | | 47/19.1 |
| 9,627,860 B2* | 4/2017 | Proserpio | H02B 1/014 |
| 9,807,904 B2* | 10/2017 | Weber | H05K 7/183 |
| 2008/0272071 A1 | 11/2008 | Sonntag | |
| 2009/0303666 A1 | 12/2009 | Brizes et al. | |
| 2011/0311333 A1* | 12/2011 | Schaser | F16B 43/001 |
| | | | 411/378 |

\* cited by examiner

PLASTIC ENCLOSURE FOR ENCLOSING INDUSTRIAL COMPONENTS

This application is a National Stage Application of PCT/FI2017/050766, filed 8 Nov. 2017, and which application is incorporated herein by reference. To the extent appropriate, a claim of priority is made to the above disclosed application.

FIELD OF THE INVENTION

The present invention relates to a molded plastic enclosure for enclosing industrial components.

BACKGROUND OF THE INVENTION

Enclosures are available for protecting industrial equipment in numerous applications from various external risk factors, among them dust, water, moisture, impacts and tampering. Such enclosures are commonly called as industrial enclosures. The industrial components to be enclosed in such an enclosure may be e.g. electrical components, electronic components, and/or equipment that does not involve electricity, such as pneumatic equipment, hydraulic equipment, fiber optics equipment, such as optic fiber splices, optic fiber connectors, optic fiber amplifiers etc. The enclosure must also provide a degree of protection to personnel against incidental contact with the equipment enclosed in the enclosure. Further, the enclosure must provide a degree of protection against the surrounding environment for enclosed equipment. Frequent access to the components within such enclosures is common for adjustments, maintenance, and inspection of the components. The enclosure comprises a case made of plastics. The enclosure may also comprise a lid to cover the case. The lid may be hinged to the case to be openable and closable and to be sealed thereto. The case comprises a rectangular rear wall and four side walls delimiting an interior having four corners at the junctures of side walls. The rear wall and the side walls together form a monolithic unitary box-like container which has a mouth opening at one side enabling access to the interior. Each corner comprises fastening means for fastening of one or more panels inside the interior in parallel and at a desired distance relative to the rear wall. The panel serves as an installation substrate for the industrial components. In prior art, e.g. from U.S. Pat. Nos. 5,084,596 and 6,604,798, are known fastening means arranged in the corners for fastening of panels which fastening means include ribs or flanges arranged as guides or tracks. For the sake of simplicity of structure, the ribs or flanges are molded integrally as unitary monolithic structures with the side walls. The flanges or ribs extend along the side walls between the rear wall and the mouth opening. The panels are mounted by mounting brackets which are fastened to these flanges or ribs. The mounting brackets can be slid along the guides provided by the flanges or ribs to a desirable level relative to the rear wall or mouth opening and attached stationary to hold the panels at said level. A drawback of using such guides along which the sliding mounting bracket can slide is that for the installer it is difficult to place all the four brackets in the corners of the case at exactly the same level. Therefore it would be desirable to have an enclosure wherein the structure of the case and the panel fastening system is as simple as possible with the rib members being molded integrally as unitary monolithic structures with the side walls, and, at the same time, has fastening means that enable exact and precise placing of the panels at an exact level relative to the case.

OBJECTIVE OF THE INVENTION

The objective of the invention is to alleviate the disadvantages mentioned above.

SUMMARY OF THE INVENTION

According to a first aspect, the present invention provides a plastic enclosure for enclosing industrial components. The enclosure comprises a case made of plastics. The case comprises a rectangular rear wall and four side walls delimiting an interior having four corners at the junctures of side walls. The rear wall and the side walls together form a monolithic unitary box-like container which has a mouth opening at one side enabling access to the interior. Each corner comprises fastening means for fastening of one or more panels inside the interior in parallel and at a desired distance relative to the rear wall. The fastening means comprises a pair of rib members molded integrally as unitary monolithic structures with the side walls. The rib members extend along the side walls between the rear wall and the mouth opening. Each rib member comprises a plurality of equally spaced grooves extending at right angle relative to the longitudinal direction of the rib member. The grooves in the pair of the rib members of each corner are arranged as pairs of grooves which are mutually aligned, mutually located at the same level and facing each other. The fastening means further comprises a support block made of plastics having at least one pair of tongues adapted to be inserted into the at least one pair of grooves to form tongue-and-groove joints on two sides of the support block for holding the support block when installed to the corner, the support block having a fastening element for fastening of the panel to the support block.

The invention provides an enclosure which has a fastening means for installing of panels providing, the fastening means providing exact and precise levelling for the panels at an exact level relative to the case. The invention further provides a robust and simple and structure for the enclosure which is cheap to manufacture In an embodiment of the enclosure, the support block comprises an upper face onto which a corner region of the panel can be placed and fastened to the fastening element of the support block.

In an embodiment of the enclosure, the fastening element comprises a first hole into which a thread-forming screw, such as a PT screw, can be screwed. PT screw is a thread-forming self-tapping screw having a sharp thread which can displace the plastics material without removing it.

In an embodiment of the enclosure, the support block comprises at least one second hole into which a thread-forming screw, such as a PT screw, can be screwed.

In an embodiment of the enclosure, the fastening element is a metal insert bushing mounted inside the support block, the metal insert bushing having an inner thread into which a fastening screw can be screwed.

In an embodiment of the enclosure, the tongues are wedge-shaped and the grooves have a corresponding wedge-shape.

In an embodiment of the enclosure, the support block comprises first snap-fit means for gripping to longitudinal edges of the rib members In an embodiment of the enclosure, the support block comprises second snap-fit means for gripping a snap-fit counterpart arranged on the rear wall.

In an embodiment of the enclosure, the grooves in each pair of grooves are directed in directions which are at an angle relative to each other, the angle being in the range of 0°-45°, and the tongues of the support block are arranged in a corresponding mutual angle.

In an embodiment of the enclosure, the side walls and/or the rib members comprise level markings to assist in installation of four support blocks at an equal level relative to the rear wall and/or the mouth opening.

In an embodiment of the enclosure, the level markings are arranged at intervals along the rib members and/or along the side walls near to the rib members.

In an embodiment of the enclosure, the grooves are arranged along the rib members with a density of 5 grooves per inch (5 grooves per 25.4 mm).

In an embodiment of the enclosure, seen in the perpendicular direction of the flat upper surface, the support block has a general shape of a right-angled isosceles triangle with a hypotenuse side facing the interior of the case when installed into the corner of the case, and catheti sides having the tongues formed into cutouts of the catheti side. The metal insert bushing is arranged at an imaginary altitude of the hypotenuse side. The right angle of the isosceles triangle is flattened to allow a space between the corner of the case and the installed support block for inserting a tool therebetween for releasing the installed support block.

In an embodiment of the enclosure, the support block comprises two hook formations arranged at the catheti sides near to rounded corners between the catheti sides and the hypotenuse side, the hook formations being arranged to hook behind longitudinal edges of the rib members thereby forming the first snap-fit means.

In an embodiment of the enclosure, the rear wall comprises a protrusion at each corner of the case, the protrusion having a rigid clip thereon to form the snap-fit counterpart.

In an embodiment of the enclosure, the support block comprises a lower face facing to opposite direction relative to the upper flat face, the lower face comprising a recess to receive the protrusion therein, and a lip portion to cover the recess, the lower face of the cover portion having an indentation adapted to receive the clip therein to form the second snap-fit means when the support block is installed at the lowest position in the case near to the rear wall.

In an embodiment of the enclosure, the support block comprises a hinge for hinging a swing-out panel attached to the support block.

In an embodiment of the enclosure, the support block comprises a first support block member comprising the tongues and a second support block member which is hinged by the hinge to the first support block member, the second support block member having the fastening element for fastening of the swing-out panel to the second support block member.

In an embodiment of the enclosure, the first support block member comprises a hinge pin and the second support block member comprises a pin seat to receive the hinge pin therein, so that the second support block member is rotatable around the hinge pin.

In an embodiment of the enclosure, the enclosure comprises a lid molded from plastics for covering the case, the lid being hinged by one or more hinges.

In an embodiment of the enclosure, the enclosure comprises one or more a latch devices for locking the lid relative to the case.

It is to be understood that the aspects and embodiments of the invention described above may be used in any combination with each other. Several of the aspects and embodiments may be combined together to form a further embodiment of the invention.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION OF THE INVENTION

Figure 1:
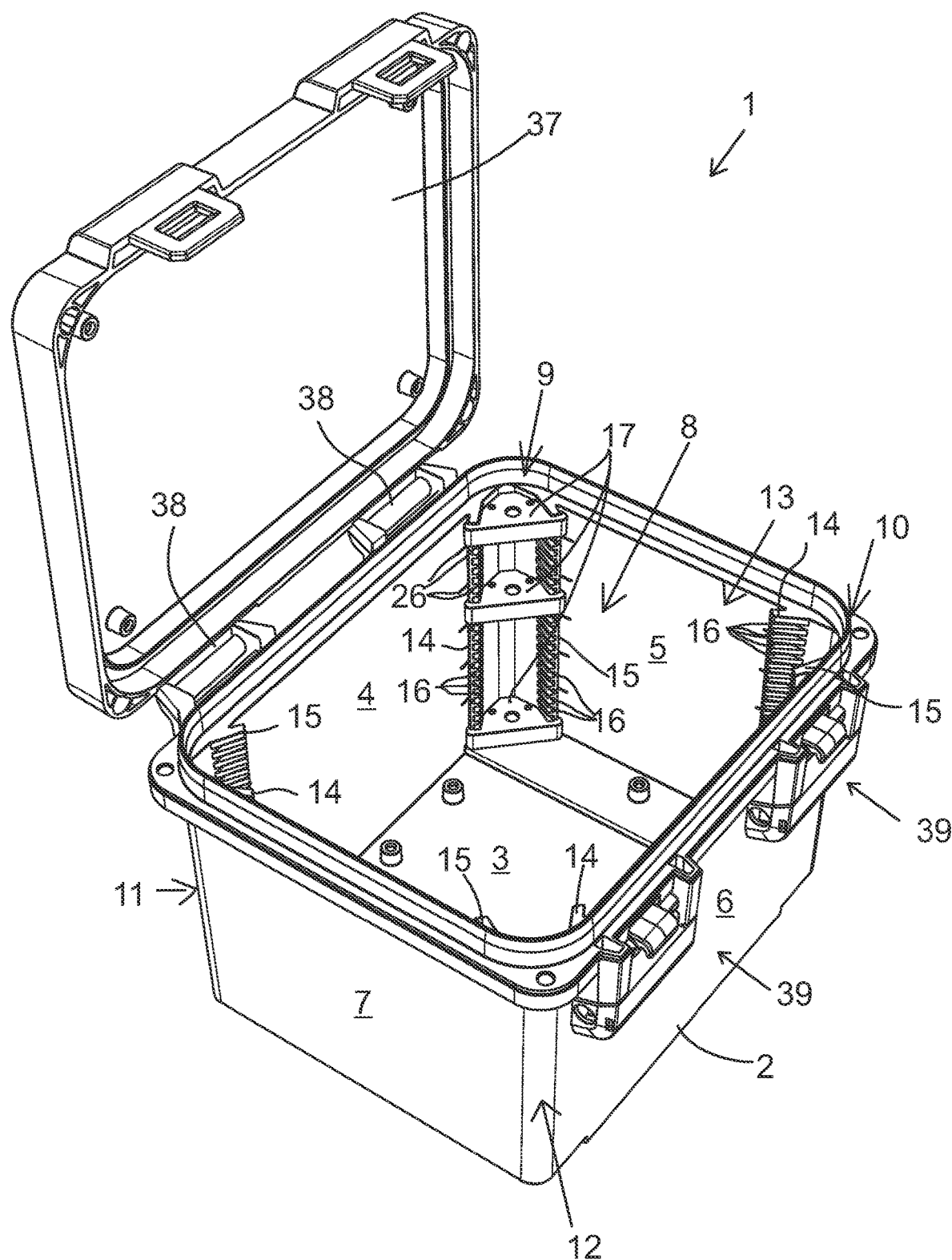
FIG. 1 is an axonometric view of the plastic enclosure according to an embodiment of the invention, seen obliquely from above.

FIG. 1 shows a plastic enclosure 1 for enclosing industrial components or equipment. Industrial components to be enclosed in the enclosure 1 may be e.g. electrical components, electronic components, and/or equipment that does not involve electricity, such as pneumatic equipment, hydraulic equipment, fiber optics equipment, such as optic fiber splices, optic fiber connectors, optic fiber amplifiers etc. The enclosure comprises a case 2 made of plastics. The case 2 comprises a rectangular rear wall 3 and four side walls 4, 5, 6, 7 which delimit an interior 8 having four corners 9, 10, 11, 12 at the junctures of side walls. The rear wall 3 and the side walls 4, 5, 6, 7 together form a monolithic unitary box-like container which has a mouth opening 13 at one side enabling access to the interior 8. The enclosure 1 comprises a lid 37 molded from plastics for covering the case 2. The lid 37 is hinged by one or more hinges 38. The enclosure 1 further comprises two latch devices 39 for locking the lid 37 relative to the case 2.

Each corner 9, 10, 11, 12 of the case 2 comprises fastening means for fastening of one or more panels P (see also FIG.

5) inside the interior of the case 2 in parallel and at a desired distance relative to the rear wall 3. The fastening means comprises a pair of rib members 14, 15 molded integrally as unitary monolithic structures with the side walls 4, 5, 6, 7. The rib members 14, 15 extend along the side walls between the rear wall and the mouth opening in each corner 9, 10, 11, 12. Each rib member 14, 15 comprises a plurality of equally spaced grooves 16 extending at right angle relative to the longitudinal direction of the rib member 14, 15. In one example, the grooves 16 are arranged along the rib members 14, 15 with a density of 5 grooves per inch (=5 grooves per 25.4 mm).

The grooves 16 in the pair of the rib members 14, 15 of each of the four corners 9, 10, 11, 12 are arranged as pairs of grooves which are mutually aligned, mutually located at the same level and facing each other.

Figure 5:
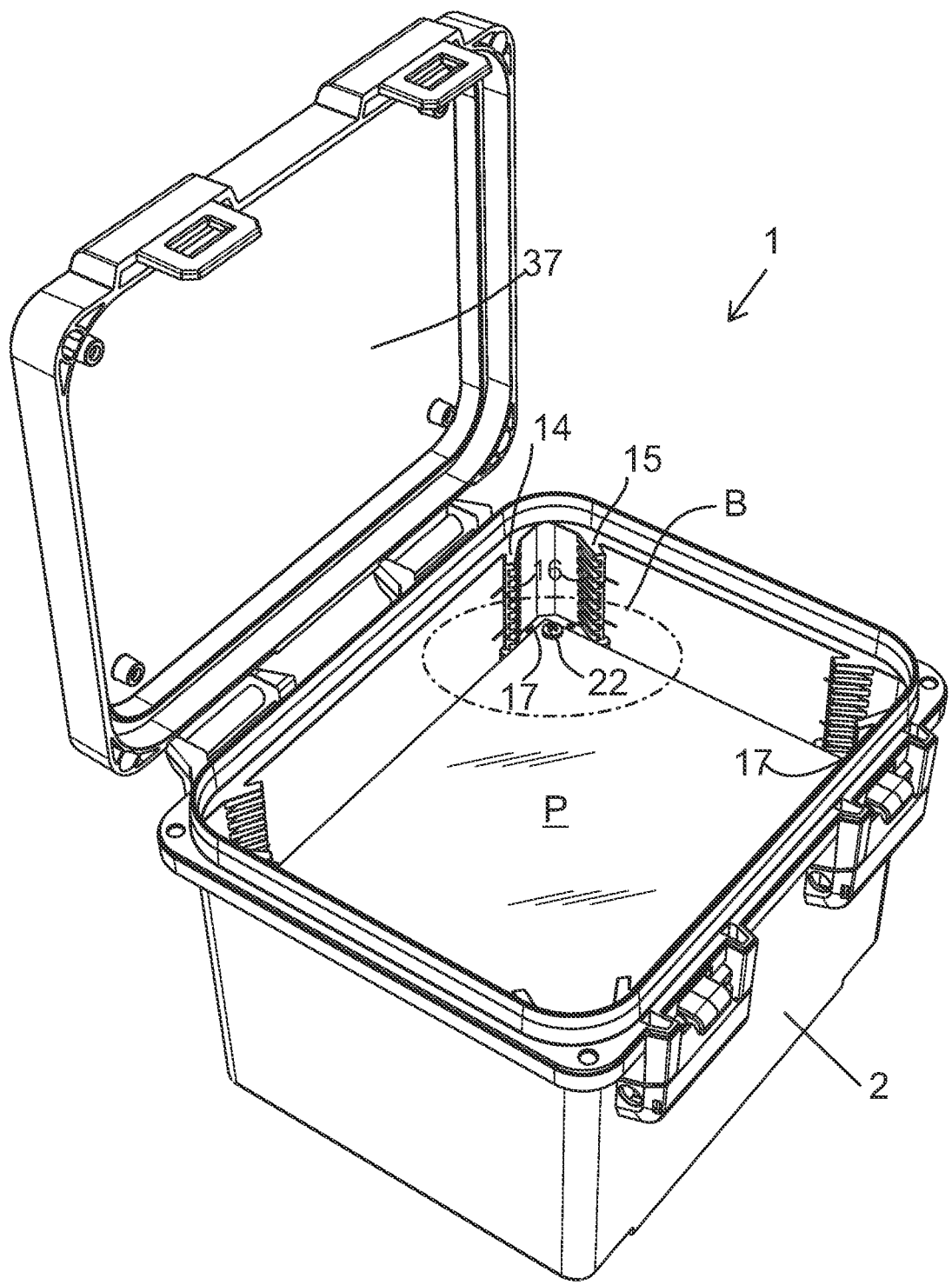
FIG. 5 shows the enclosure of FIG. 1 with a panel installed into the interior of the case with support blocks of FIG. 3.

The fastening means further comprises a support block 17 made of plastics having pair of tongues 18 adapted to be inserted into the pair of grooves 16 to form tongue-and-groove joints on two sides of the support block 17 for holding the support block 17 when installed to the corner. The support block 17 has a fastening element 19 for fastening of the panel to the support block. As an example, FIG. 1 shows three support blocks 17 installed at three different levels. One of the support blocks 17 is installed at a lowest level position near to the rear wall 3 to provide a fastening point for a back panel (not shown). One of the support blocks 17 is installed at a highest level position near to the mouth opening 13 to provide a fastening point for a cover panel P (see also FIG. 9)). One of the support blocks 17 is installed at an intermediate level position located between the lowest and highest level positions to provide a fastening point for an intermediate panel (shown in FIG. 5).

Figure 3:
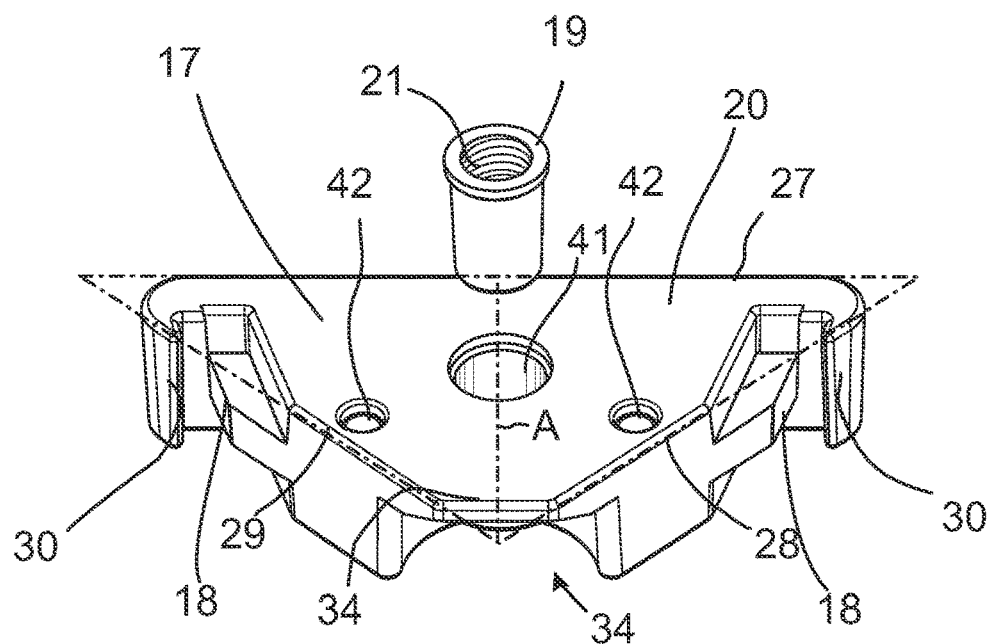
FIG. 3 shows an axonometric explosion view of a support block of the enclosure of FIGS. 1 and 2.
Figure 4:
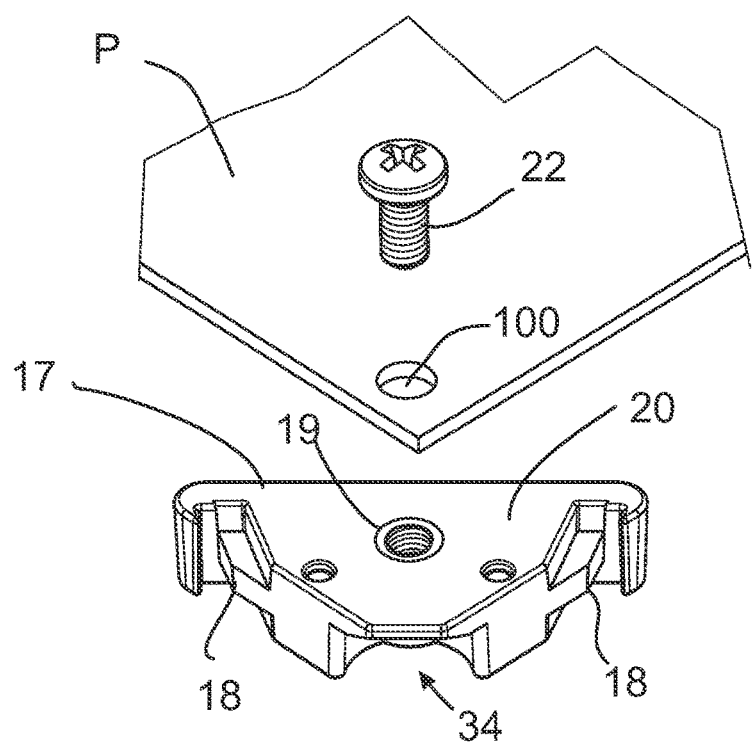
FIG. 4 shows an axonometric explosion view of the assembly of the support block and a corner region of a panel.
Figure 9:
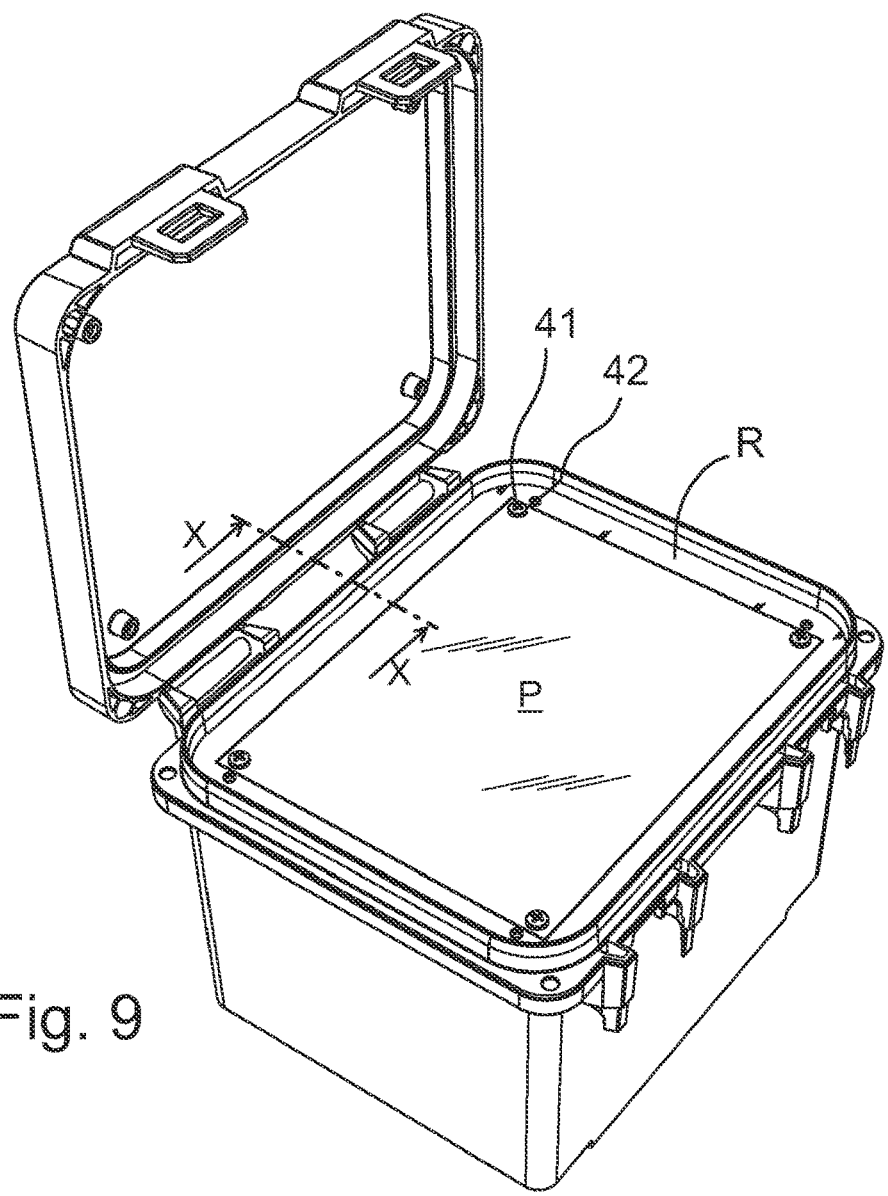
FIG. 9 shows the enclosure of FIG. 1 with a panel installed at the uppermost position in the case with the support blocks of FIG. 3, and having a rim flange attached to the support blocks.
Figure 10:
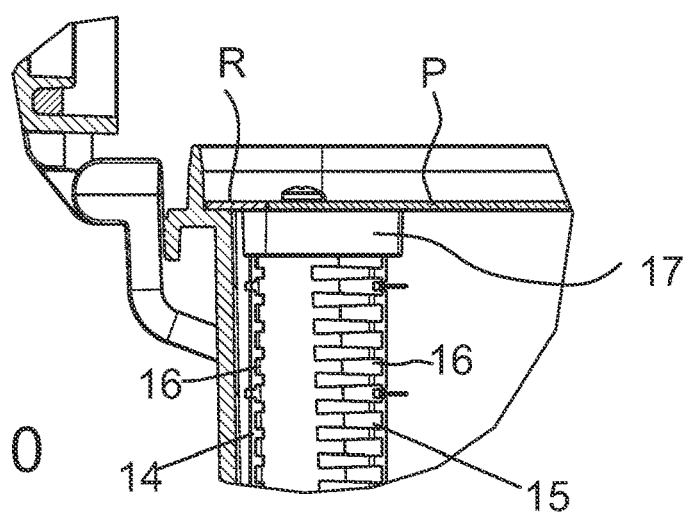
FIG. 10 is a cross-section X-X from FIG. 9.

Referring to FIGS. 3 and 4, the support block 17 comprises a flat upper face 20 onto which a corner region of the panel P can be placed and fastened to the fastening element 19 of the support block. The fastening element 19 may be a metal insert bushing mounted inside the support block 17. The metal insert bushing 19 has an inner thread 21 into which a fastening screw 22 can be screwed via a screw hole 100 of the panel P. Alternatively, the fastening element may be a first hole 41 (without metal insert) into which a thread-forming screw, such as an PT screw, can be screwed. The support block 17 comprises also two second holes 42 into which a self-threading screw, such as a PT screw, can be screwed. FIGS. 9 and 10 show an embodiment wherein the support blocks are installed at a highest level position near to the mouth opening 13 to provide a fastening point for a cover panel P. A rim flange R is installed to surround the cover panel P to cover the gap between the case and the cover panel. The rim flange R can be fastened by thread-forming screws which are threaded into the second holes 42 of the support block 17.

Figure 8:
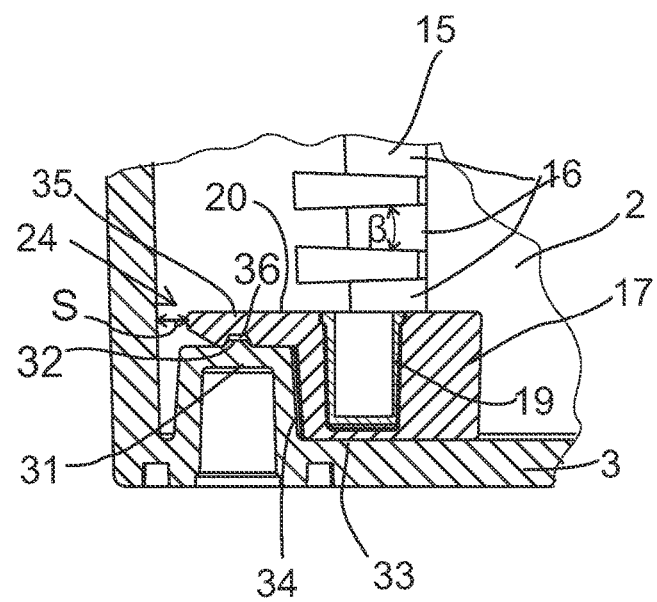
FIG. 8 is a cross-section VIII-VIII from FIG. 6, a support block being installed near to the rear wall of the case.

As FIG. 8 shows, since the support block 17 includes the fastening means 19 for supporting a panel P, there is no need to include any metal insert bushings having an inner thread to the material of the case 2. In prior art, if the metal insert bushing (or its inner thread) embedded in the material of the rear wall of the case is damaged or destroyed, the whole case or enclosure 1 does not have to be replaced with an intact case or enclosure. In the enclosure of the invention, if the metal insert bushing 19 is damaged, only the support block 17 needs to be replaced, which is much cheaper than replacing the whole case.

The tongues 18 are wedge-shaped and the grooves 16 have a corresponding wedge-shape with a wedge angle β as can be seen in FIG. 8. The wedge angle β is preferably 2°. The wedge angle of the grooves 16 enhances exact positioning and firm holding of the tongues 18 in the grooves 16, and also for releasing of injection mold parts which are for forming of the grooves 16.

Figure 2:
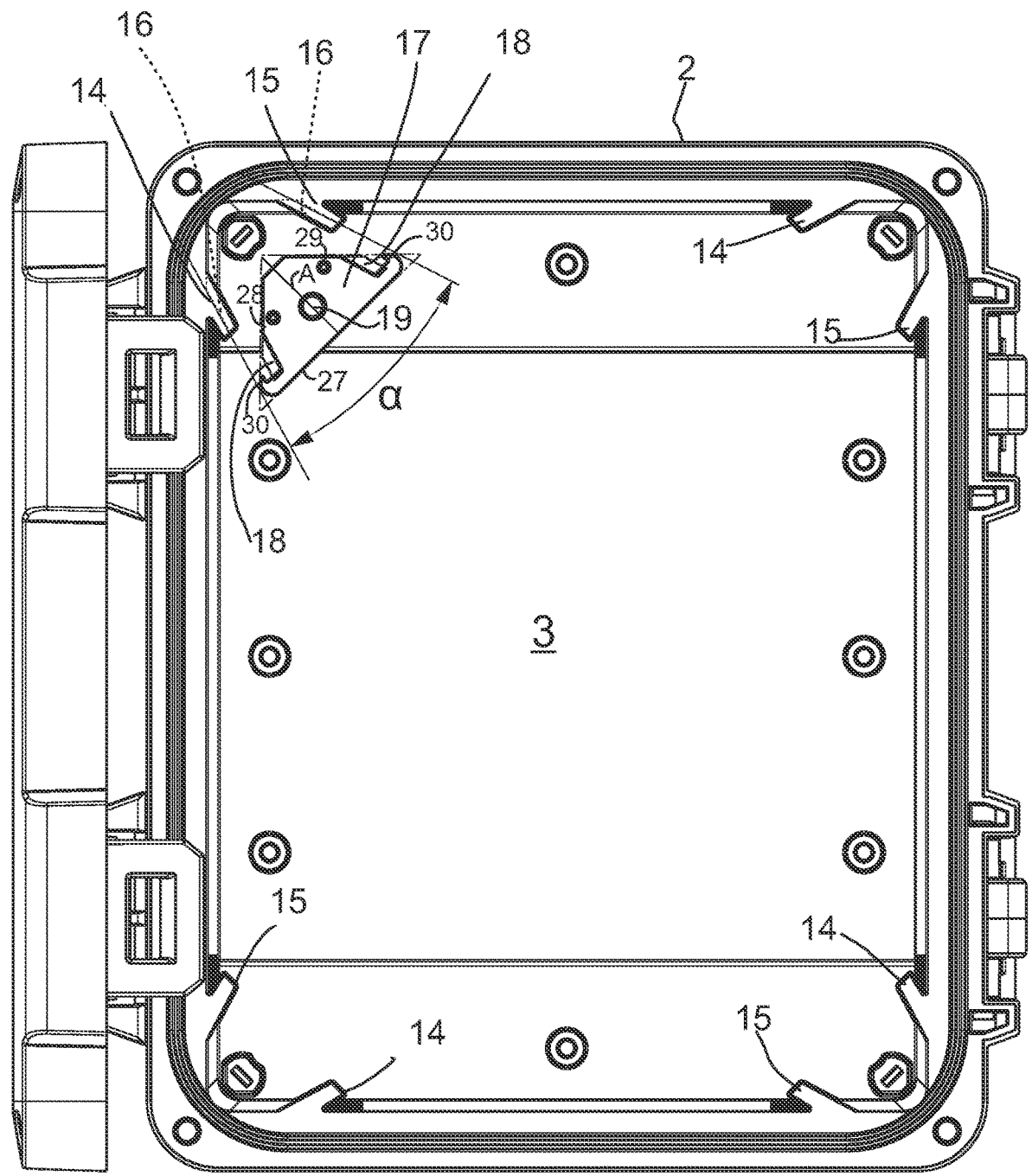
FIG. 2 is a plan view of the enclosure of Figure seen from above.

As illustrated in FIGS. 2 to 4, the support block 17 comprises first snap-fit means 23 for gripping to longitudinal edges of the rib members 14, 15. As seen in the perpendicular direction of the flat upper face 20, the support block 17 has a general shape of a right-angled isosceles triangle. The imaginary triangle has been drawn in FIGS. 2 and 3 with a dot-and-dash line as an envelope enclosing the support block 17. The triangular support block shape has a hypotenuse side 27 facing the interior of the case 2 when installed into the corner 9, 10, 11, 12 of the case 2, and catheti sides 28, 29. The tongues 18 are formed into cutouts of the catheti sides 28, 29. The metal insert bushing 19 is arranged at an imaginary altitude A of the hypotenuse side 27. The right angle of the isosceles triangle shape of the support block 17 is flattened to allow a space S (see FIGS. 6 and 8) between the corner of the case 2 and the installed support block 17. A tool, such as a tip of a screwdriver or like, can be inserted into the space S for releasing the installed support block 17.

Figure 6:
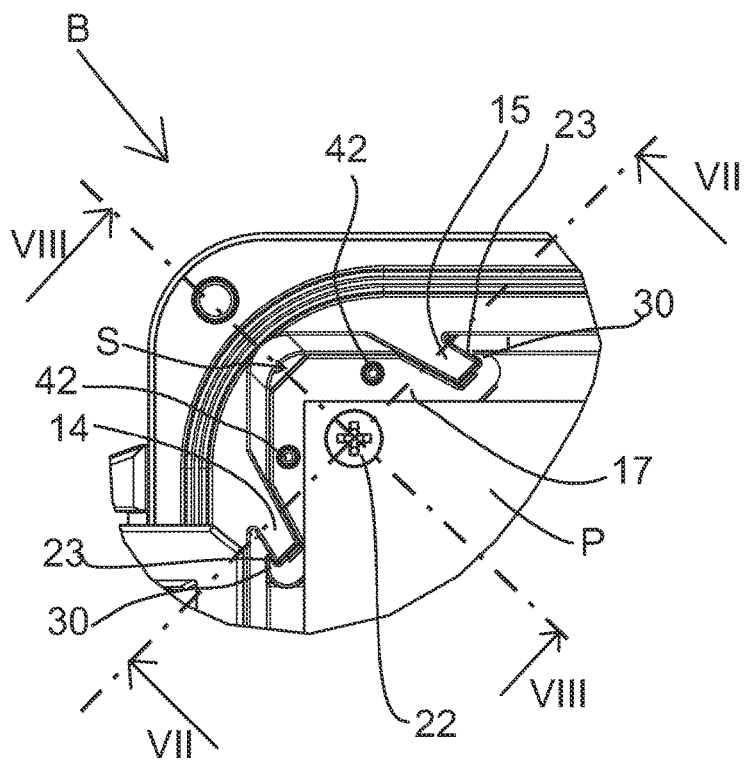
FIG. 6 shows a detail B from FIG. 5, seen from above as a plan view.

Referring to FIGS. 3, 4 and 6 the support block 17 comprises two hook formations 30 arranged at the catheti sides 28, 29 near to rounded corners between the catheti sides and the hypotenuse side 27. The hook formations 30 are arranged to hook behind longitudinal edges of the rib members 14, 15 thereby forming the first snap-fit means 23.

Figure 7:
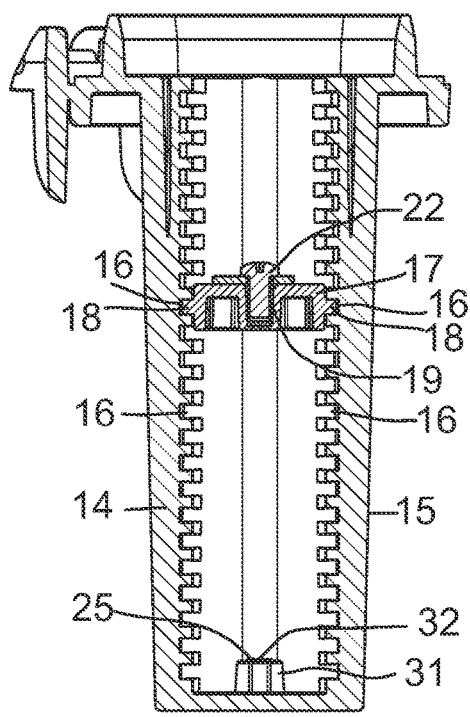
FIG. 7 is a cross-section VII-VII from FIG. 6.

Referring to FIGS. 7 and 8, the support block 17 also comprises second snap-fit means 24 for gripping a snap-fit counterpart 25 arranged on the rear wall 3. The rear wall 3 comprises a protrusion 31 at each corner 9, 10, 11, 12 of the case 2. The protrusion 31 has a rigid clip 32 thereon to form the snap-fit counter-part 25. The support block 17 comprises a lower face 33 which faces to opposite direction relative to the upper flat face 20. The lower face 33 comprises a recess 34 to receive the protrusion 31 therein. A lip portion 35 of the support block 17 covers the recess 34. The lower face 33 of the support block 17 has an indentation 35 adapted to receive the clip 32 therein to form the second snap-fit means 24, when the support block is installed at the lowest position in the case 2 near to the rear wall 3.

As can be seen in FIG. 2, the grooves 16 in each pair of grooves are directed in directions which are at an angle α relative to each other, the angle α being in the range of 0°-45°. The tongues 18 of the support block 17 are arranged in a corresponding mutual angle α.

Referring again to FIG. 1, the side walls 4, 5, 6, 7 and the rib members 14, 15 comprise level markings 26. The level markings 26 assist in installation of four support blocks 17 at an equal level relative to the rear wall 3 and/or the mouth opening 13. The level markings 26 are arranged at intervals along the rib members 14, 15 and along the side walls 4, 5, 6, 7 near to the rib members.

Figure 11:
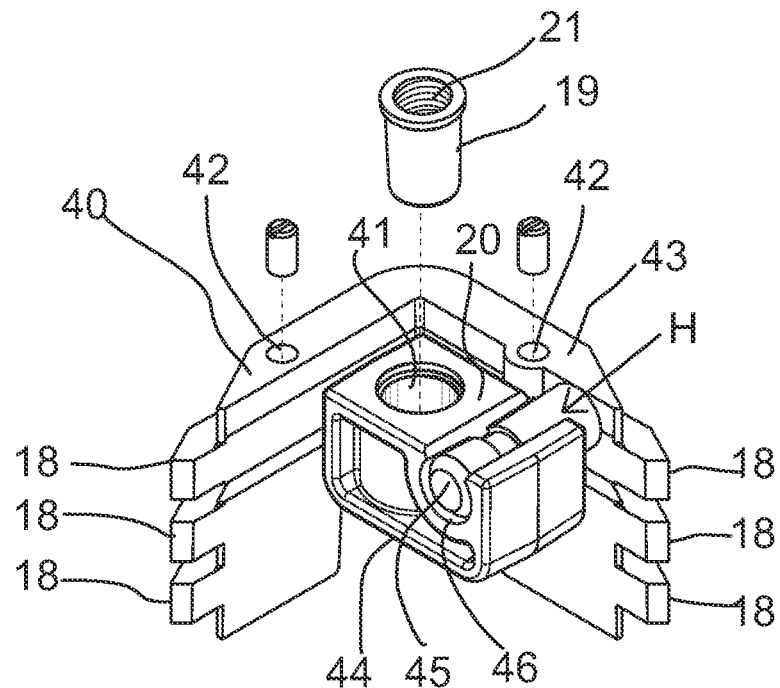
FIGS. 11 and 12 show axonometric views of a support block designed for supporting a swing-out panel.
Figure 12:
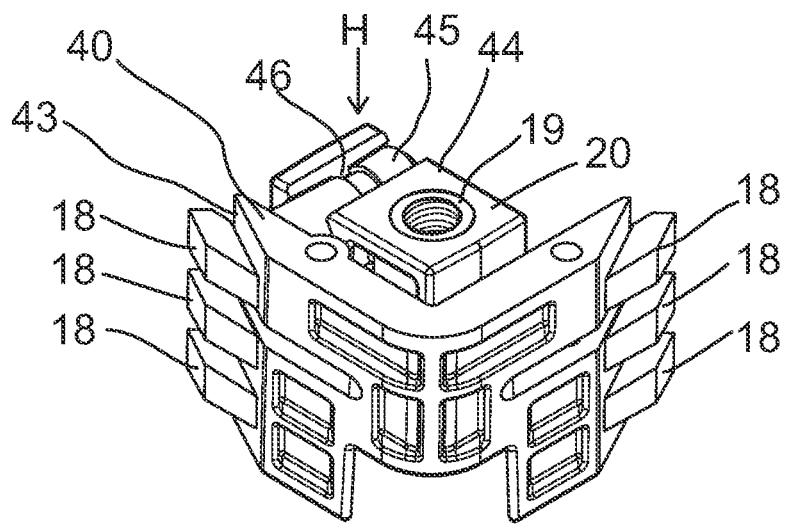
Figure 13:
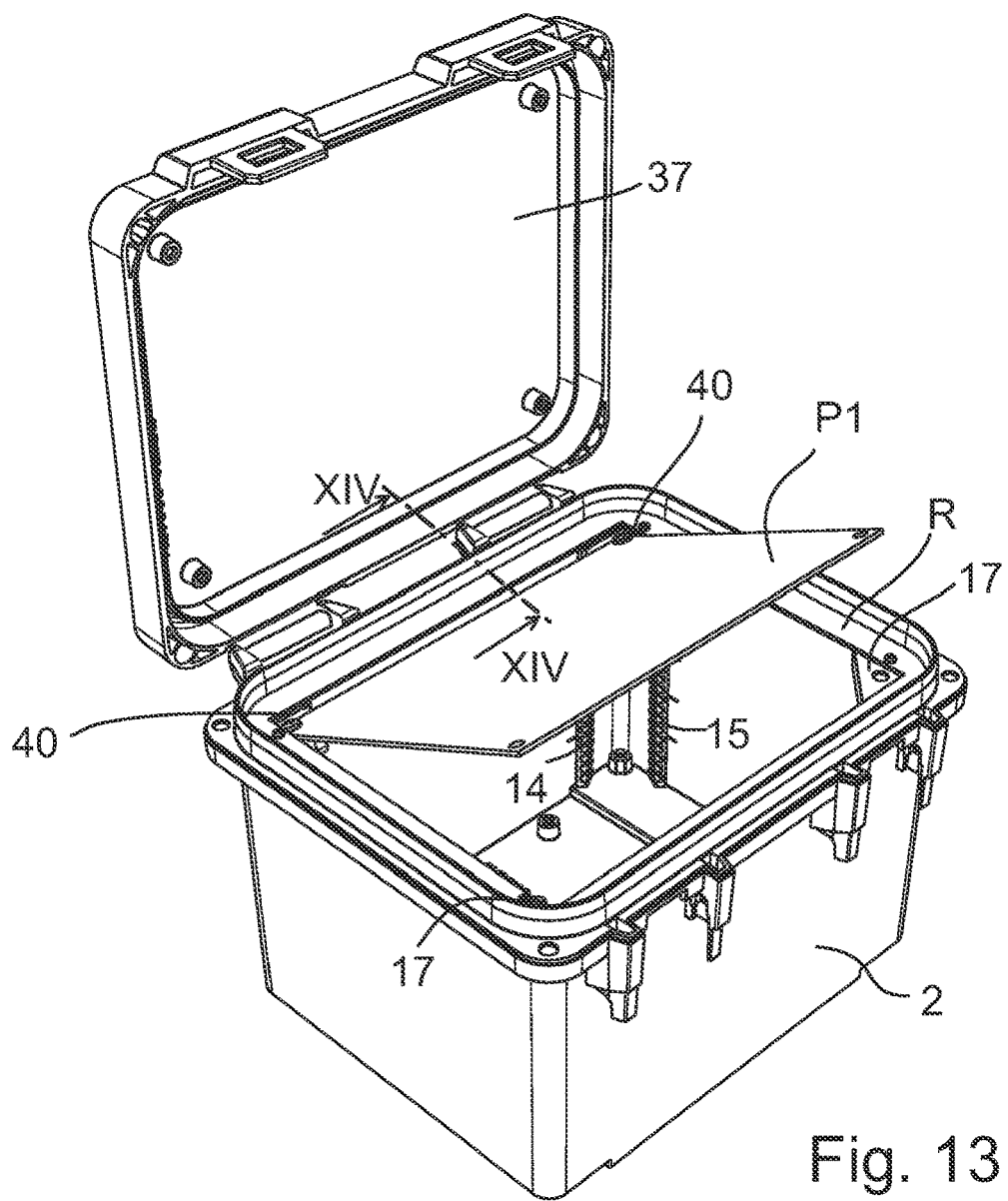
FIG. 13 shows the enclosure of FIG. 1 equipped with a swing-out panel positioned in the uppermost position in the case.
Figure 14:
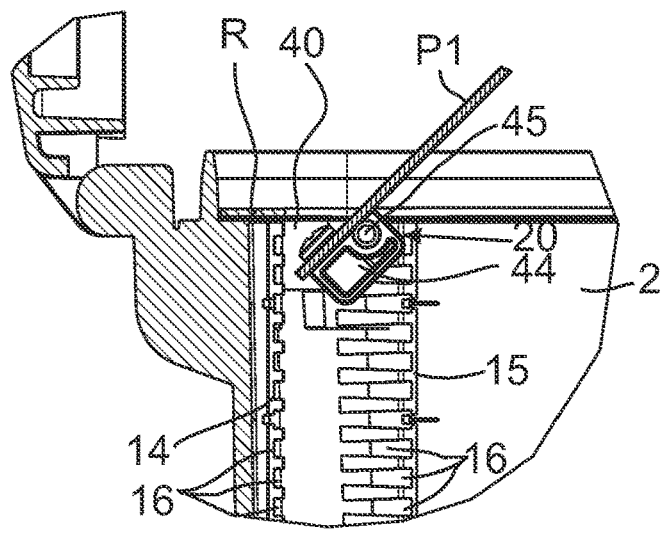
FIG. 14 is a cross-section XIV-XIV from FIG. 13.

FIGS. 11 and 12 show another embodiment of the support block 40. The support block 40 is made of plastics having three pairs of tongues 18 adapted to be inserted into three grooves 16 of the rib members 14, 15 of the case to form tongue-and-groove joints on two sides of the support block 40 for holding the support block when installed to the corner of the case 2. The support block 17 has a fastening element 19 for fastening of a swing-out panel P1 to the support block 40. The support block 40 comprises a hinge H for hinging the swing-out panel P1 attached to the support block 40. The support block 40 comprises a first support block member 43 comprising the two pairs of three tongues 18. The support block 40 also comprises a second support block member 44 which is hinged by the hinge H to the first support block member 43. The second support block member 44 has the fastening element 19 for fastening of the swing-out panel P1 to the second support block member 44. The fastening element 19 may be a metal insert bushing 19 mounted inside the second support block member 44. The metal insert bushing 19 has an inner thread 21 into which a fastening screw 22 can be screwed via a screw hole 100 of the panel P. Alternatively, the fastening element may be a first hole 41 (without metal insert) into which a thread-forming screw, such as an PT screw, can be screwed. The first support block member 42 comprises also two second holes 42 into which a self-threading screw, such as a PT screw, can be screwed. FIG. 13 shows an embodiment wherein the support blocks 40 and 17 are installed at a highest level position near to the mouth opening 13 to provide a fastening point for the swing-out panel P1. A rim flange R is installed to surround the cover panel P to cover the gap between the case 2 and the swing-out panel P1. The rim flange R can be fastened by thread-forming screws which are threaded into the second holes 42 of the support blocks 17 and 40. Referring to FIGS. 11 and 12, the first support block member 43 comprises a hinge pin 45 and the second support block member 44 comprises a pin seat 46 to receive the hinge pin therein to form said hinge H, so that the second support block member 44 is rotatable around the hinge pin 45.

Figure 15:
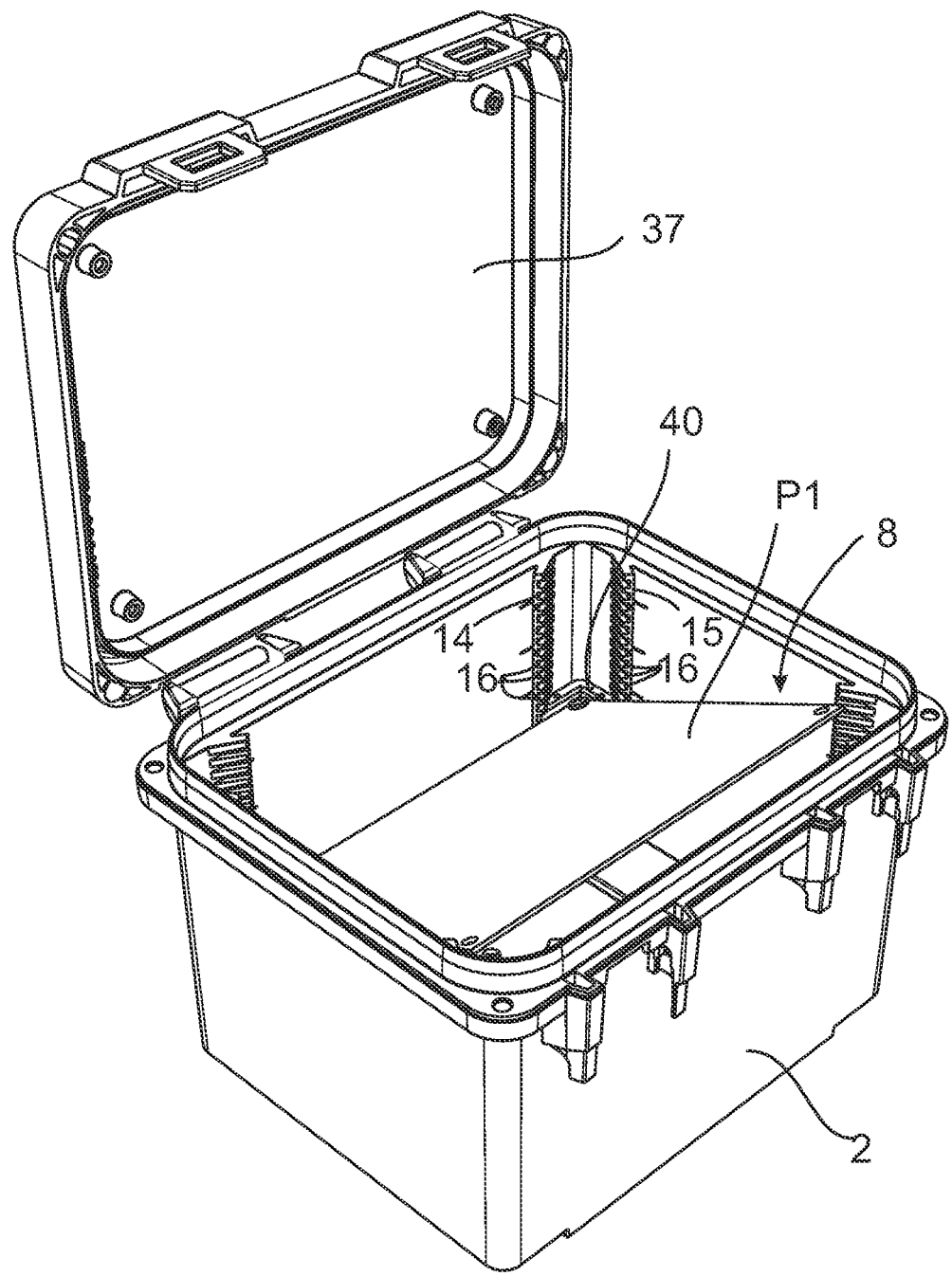
FIG. 15 shows the enclosure of FIG. 1 equipped with a swing-out panel positioned in the interior of the case.

FIG. 15 illustrates that the support block 40 of FIGS. 11 and 12 having the hinge for hinging the swing-out panel P1 can be positioned at any desired level inside the interior 8 of the case 2.

Although the invention has been the described in conjunction with a certain type of enclosure, it should be understood that the invention is not limited to any certain type of enclosure. While the present inventions have been described in connection with a number of exemplary embodiments, and implementations, the present inventions are not so limited, but rather cover various modifications, and equivalent arrangements, which fall within the purview of prospective claims.

The invention claimed is:

1. A plastic enclosure for enclosing industrial components, the enclosure comprising a case made of plastics, the case comprising a rectangular rear wall and four side walls delimiting an interior having four corners at the junctures of side walls, the rear wall and the side walls together forming a monolithic unitary box-like container which has a mouth opening at one side enabling access to the interior, each corner comprising fastening means for fastening of one or more panels inside the interior in parallel and at a desired distance relative to the rear wall, wherein the fastening means comprises a pair of rib members molded integrally as unitary monolithic structures with the side walls, the rib members extending along the side walls between the rear wall and the mouth opening, each rib member comprising a plurality of equally spaced grooves extending at right angle relative to the longitudinal direction of the rib member, and the grooves in the pair of the rib members of each corner are arranged as pairs of grooves which are mutually aligned, mutually located at the same level and facing each other, and a support block made of plastics having at least one pair of tongues adapted to be inserted into the at least one pair of grooves to form tongue-and-groove joints on two sides of the support block for holding the support block when installed to the corner, the support block having a fastening element for fastening of the panel to the support block.

2. A plastic enclosure according to claim 1, wherein the support block comprises an upper face onto which a corner region of the panel can be placed and fastened to the fastening element of the support block.

3. A plastic enclosure according to claim 1, wherein the fastening element comprises a first hole into which a self-threading screw, such as a PT screw, can be screwed.

4. A plastic enclosure according to claim 1, wherein the support block comprises at least one second hole into which a self-threading screw, such as a PT screw, can be screwed.

5. A plastic enclosure according to claim 1, wherein the fastening element comprises a metal insert bushing mounted inside the support block, the metal insert bushing having an inner thread into which a fastening screw can be screwed.

6. A plastic enclosure according to claim 1, wherein the tongues are wedge-shaped and the grooves have a corresponding wedge-shape.

7. A plastic enclosure according to claim 1, wherein the support block comprises first snap-fit means for gripping to longitudinal edges of the rib members.

8. A plastic enclosure according to claim 1, wherein the support block comprises second snap-fit means for gripping a snap-fit counterpart arranged on the rear wall.

9. A plastic enclosure according to claim 8, wherein the rear wall comprises a protrusion at each corner of the case, the protrusion having a rigid clip thereon to form the snap-fit counterpart.

10. A plastic enclosure according to claim 9, wherein the support block comprises a lower face facing to opposite direction relative to the upper face, the lower face comprising a recess to receive the protrusion therein, and a lip portion to cover the recess, the lower face having an indentation adapted to receive the clip therein to form the second snap-fit means when the support block is installed at the lowest position near to the rear wall in the interior of the case.

11. A plastic enclosure according to claim 1, wherein the grooves in each pair of grooves are directed in directions which are at an angle (a) relative to each other, the angle being in the range of 0°-45°, and the tongues of the support block are arranged in a corresponding mutual angle.

12. A plastic enclosure according to claim 1, wherein the side walls and/or the rib members comprise level markings to assist in installation of four support blocks at an equal level relative to the rear wall and/or relative to the mouth opening.

13. A plastic enclosure according to claim 12, wherein the level markings are arranged at intervals along the rib members and/or along the side walls near to the rib members.

14. A plastic enclosure according to claim 1, wherein the grooves are arranged along the rib members with a density of 5 grooves per inch.

15. A plastic enclosure according to claim 1, wherein, seen in the perpendicular direction of the upper face, the support block has a general shape of a right-angled isosceles triangle with a hypotenuse side facing the interior of the case when installed into the corner of the case, and catheti sides having the tongues formed into cutouts of the catheti sides, and the metal insert bushing is arranged at an imaginary altitude of the hypotenuse side, and the right angle of the isosceles triangle is flattened to allow a space between the corner of the case and the installed support block for inserting a tool therebetween for releasing the installed support block.

16. A plastic enclosure according to claim 15, wherein the support block comprises two hook formations arranged at the catheti sides near to rounded corners between the catheti sides and the hypotenuse side, the hook formations being arranged to hook behind longitudinal edges of the rib members thereby forming the first snap-fit means.

17. A plastic enclosure according to claim 1, wherein the support block comprises a hinge for hinging a swing-out panel attached to the support block.

18. A plastic enclosure according claim 17, wherein the support block comprises a first support block member comprising the tongues and a second support block member which is hinged by the hinge to the first support block member, the second support block member having the fastening element for fastening of the swing-out panel to the second support block member.

19. A plastic enclosure according claim 18, wherein the first support block member comprises a hinge pin and the second support block member comprises a pin seat to receive the hinge pin therein, so that the second support block member is rotatable around the hinge pin.

20. A plastic enclosure according to claim 1, wherein the enclosure comprises a lid molded from plastics for covering the case, the lid being hinged by one or more hinges.

21. A plastic enclosure according to claim 20, wherein the enclosure comprises one or more a latch devices for locking the lid relative to the case.

* * * * *